United States Patent
Choi et al.

(10) Patent No.: US 7,288,966 B2
(45) Date of Patent: Oct. 30, 2007

(54) PROGRAMMABLE IMPEDANCE CONTROLLER AND METHOD FOR OPERATING

(75) Inventors: Myung-Han Choi, Gyeonggi-do (KR); Nam-Seog Kim, Gyeonggi-do (KR); Chul-Sung Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 171 days.

(21) Appl. No.: 11/175,634

(22) Filed: Jul. 5, 2005

(65) Prior Publication Data

US 2006/0006903 A1   Jan. 12, 2006

(30) Foreign Application Priority Data

Jul. 7, 2004   (KR) .................... 10-2004-0052555

(51) Int. Cl.
*H03K 19/0175* (2006.01)

(52) U.S. Cl. .................... 326/83; 326/82; 326/80; 326/30; 327/530

(58) Field of Classification Search ............. 326/83, 326/30

See application file for complete search history.

(56) References Cited

U.S. PATENT DOCUMENTS

| | | | |
|---|---|---|---|
| 6,307,424 B1 | 10/2001 | Lee | 327/530 |
| 6,316,957 B1 | 11/2001 | Ang et al. | 326/30 |
| 6,573,746 B2 * | 6/2003 | Kim et al. | 326/30 |
| 6,975,813 B1 * | 12/2005 | Inoue et al. | 398/197 |
| 2002/0050838 A1 * | 5/2002 | Kim et al. | 326/30 |

* cited by examiner

*Primary Examiner*—Rexford Barnie
*Assistant Examiner*—Crystal L Hammond
(74) *Attorney, Agent, or Firm*—Marger Johnson & McCollom, P.C.

(57) ABSTRACT

A programmable impedance controller and a method of operating to prevent or substantially reduce internal noise and an influence from external noise lasting for a long time. The programmable impedance controller for comparing a pad voltage of a pad connected to an external determination impedance with a reference voltage, and for outputting an impedance control signal, and for performing a digital coding to an impedance code corresponding to the impedance control signal, includes a clock controller and a counter. The clock controller outputs a first clock signal in a reset mode and outputs a second clock signal in an operating mode, in response to an applied clock signal. The counter sequentially updates code data, one code step per clock period, in response to the first clock signal in the reset mode, and outputs update code data. In an operating mode, the counter outputs the update code data updated in the reset mode in response to the second clock signal.

10 Claims, 9 Drawing Sheets

US 7,288,966 B2

1

PROGRAMMABLE IMPEDANCE CONTROLLER AND METHOD FOR OPERATING

CROSS REFERENCE TO RELATED APPLICATIONS

This application claims priority from Korean Patent Application No. 2004-52555, filed on Jul. 7, 2004, the contents of which are hereby incorporated by reference for all purposes.

BACKGROUND

1. Field of the Invention

The present invention relates to a programmable impedance controller and a method of operating the same, which is capable of substantially reducing influence of internal and external noise.

2. Description of the Related Art

Various semiconductor devices such as microcomputers, memory devices, etc. provide various kinds of electrical appliances. Most semiconductor devices have input/output pins for transmitting data from outside input and output circuits for providing internal data to the outside, etc.

Internal data in such a semiconductor device may be provided to another semiconductor device through a transmission line. To appropriately transmit an output signal, an output impedance and an impedance of the transmission line should be matched mutually, and to receive an input signal without distortion, an impedance of transmission line and an input impedance should be matched with each other. In general, the former is referred to as output impedance (ZQ) control, and the latter is referred to as chip termination (ZT) control. Generally, output impedance control is performed on an output driver and chip termination control is performed on an input terminator circuit.

One method to realize impedance matching is to design a system so that an output impedance of the system coincides with an impedance of transmission line used in the system, and to use a termination in an input terminal to substantially reduce a reflected wave. This method is susceptible to temperature change or process change, etc. between an actually operating environment of the system and a design environment. Thus, a system to provide accurate impedance matching regardless of external environmental change is required. A programmable impedance controller (PIC) capable of sensing a characteristic impedance of a transmission line and transferring information to an output circuit has been proposed. The PIC can match the impedance with an impedance value, and update digital codes for a predetermined period actively against a voltage and temperature change, to match internal impedance with external impedance, when a user connects impedance with an outer side of the system. One example of the programmable impedance controller having such a programmable impedance control operation is disclosed in U.S. Pat. No. 6,307,424.

Another example of such a programmable impedance controller is described referring to a block diagram of FIG. 1 according to the prior art. Referring to FIG. 1, a programmable impedance controller according to the prior art includes an I/O pad having an external impedance RQ, RT; a detector 10 that is constructed of an array of transistors that are programmed to have the same impedance with the external impedance $R_Q$, $R_T$); a selector 40 for comparing an output of the detector 10 with a reference voltage (½VDDQ) and controlling an output of counter 30; a counter 30 for

2 generating a digital impedance code; a code register 50 for storing an impedance code; and a code transmitter 60 for transmitting the impedance codes in series.

The programmable impedance controller according to the prior art is configured so that an external impedance is connected to an external pin and a semiconductor device has an output impedance value desired within specification of about 35 to 70Ω.

A general operation of the programmable impedance controller will be described as follows.

For example, a matching external impedance RQ, RT having an impedance value corresponding to about 5 times the impedance value of an external device is connected between an external pad ZQ, ZT PAD and a ground. The comparator 20 compares a pad voltage of external pad ZQ, ZT PAD connected to the external impedance RQ, RT with a reference voltage ½VDDQ, and outputs an impedance control signal. The counter 30 detects the impedance control signal, performs an up/down counting in response to the impedance control signal, and outputs control code data A for turning on or turning off P-channel and N-channel MOS (Metal Oxide Semiconductor) transistors within an impedance matching transistor array. The counter 30 increases or decreases the control code data A until a level of the reference voltage ½VDDQ becomes equal to a level of the pad voltage. Hence, a selected transistor within a P-channel and N-channel transistor array is turned on or off and the level of reference voltage ½VDDQ and the level of the pad voltage become equal. In this case, the detector 10 has the same impedance as the external impedance RQ, RT.

The selector 40 senses a dithering effect and outputs a sense signal. The code register 50 stores an impedance code having a code value equal to the external impedance RQ, RT, in a register, in response to the sense signal. The dithering effect denotes that output voltage of the detectors 10 controlled by a digital code outputted from the counter 30 is not exactly formed as a voltage level equal to reference voltage ½VDDQ, and has an amplitude having a quantization error on the basis of the reference voltage ½VDDQ, and thus has vibration. The dithering effect is called an impedance locking effect. The dithering effect designates that an impedance of the detector 10 of the impedance controller becomes a value most similar to the external impedance RQ, RT. Thus, the value is detected and is stored in the code register 50.

Impedance codes B stored in the code register 50 by a sense signal of the selector 40 are transmitted in series through the code transmitter 60, and so an impedance update is performed.

FIG. 2 is a timing diagram for control code data A as an output signal of the counter 30 having a dithering effect, and for an updated impedance code B as an output signal of the code register 50. As shown in FIG. 2, after a dithering effect is generated on control code data A, several impedance codes B are changed rapidly at one time, in an updating operation. This rapid change momentarily causes many changes on impedance of an output driver or input terminator, and causes a signaling interference with internal noise of circuits.

FIG. 3 is a timing diagram of control code data A as an output signal of the counter 30, and an updated impedance code B as an output signal of the code register 50, in case external noise lasts for a fairly long time. As shown in FIG. 3, if external noise lasts for a longer duration than a dithering pattern, the noise is reflected through the impedance controller and an impedance updating operation is performed. In general, a conventional impedance controller was provided with a method of removing noise of mostly high frequency, instead of a method for removing lower frequency noise. Thus, if noise having low frequency lasts for a fairly long time, there are problems in that impedance code is again updated by control code data A changed by external noise, and the updated impedance code B has a value different from a desired impedance code.

SUMMARY

Embodiments of the invention provide a programmable impedance controller and a method of operating the same, which is capable of preventing or substantially reducing internal noise caused by a rapid change of impedance and influence from noise having low frequency.

BRIEF DESCRIPTION OF THE DRAWINGS

The above and other features of exemplary embodiments of the invention will become readily apparent from the description that follows, with reference to the attached drawings in which.

DETAILED DESCRIPTION

Exemplary embodiments of the invention are more fully described in detail with reference to FIGS. 4 and 9. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art.

Figure 1:
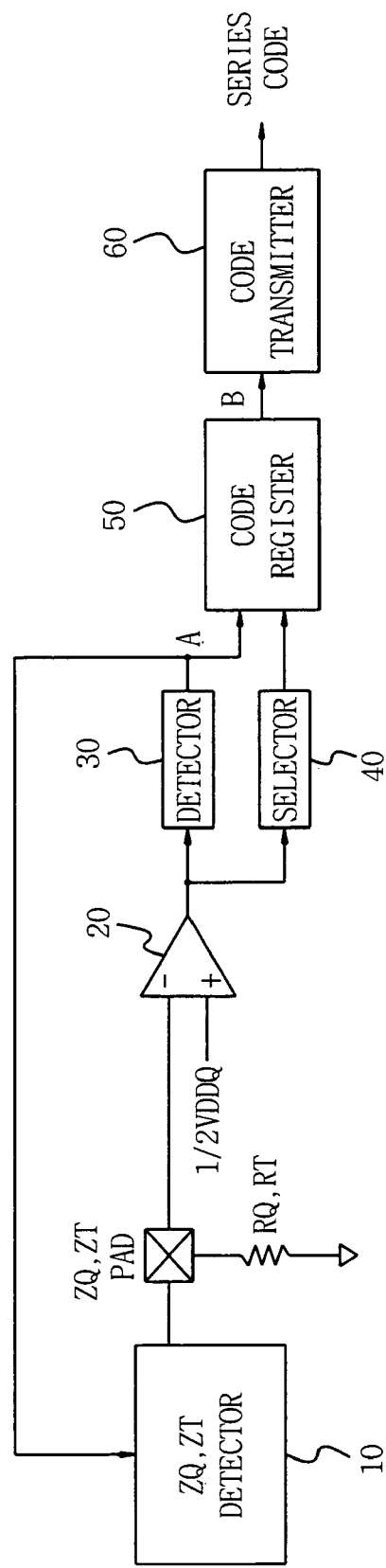
FIG. 1 is a block diagram of programmable impedance controller according to a prior art.
Figure 2:
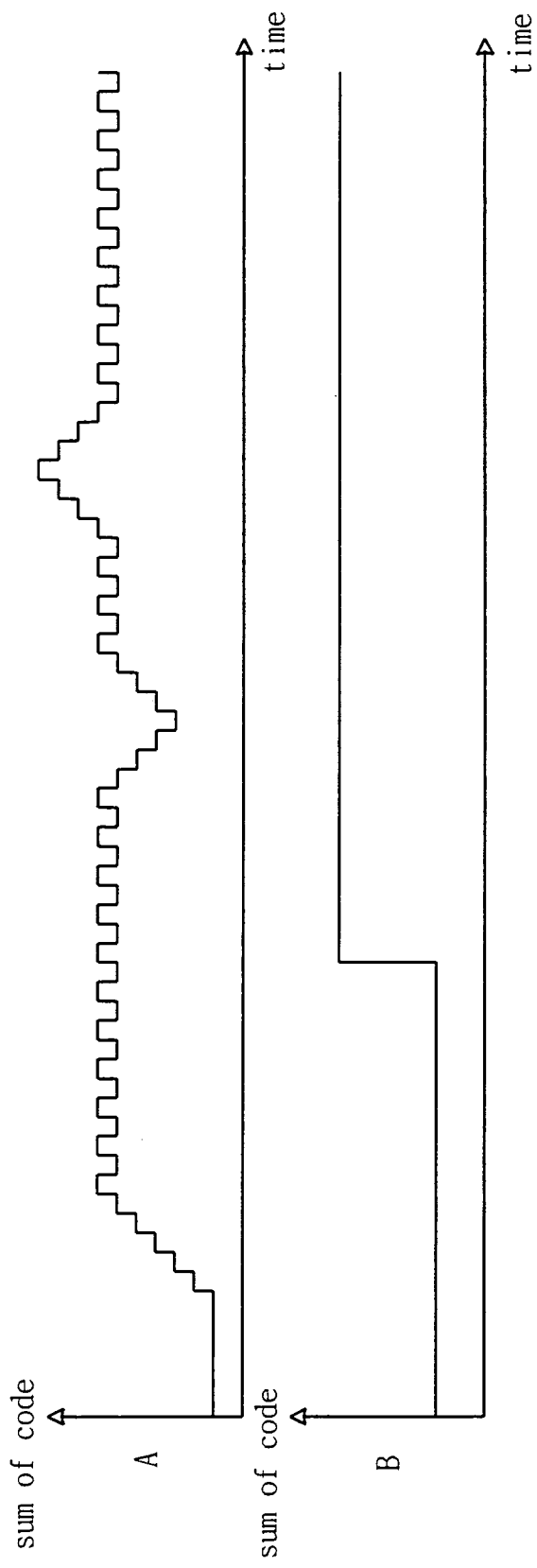
FIGS. 2 and 3 are timing diagrams for operations referred to in FIG. 1.
Figure 3:
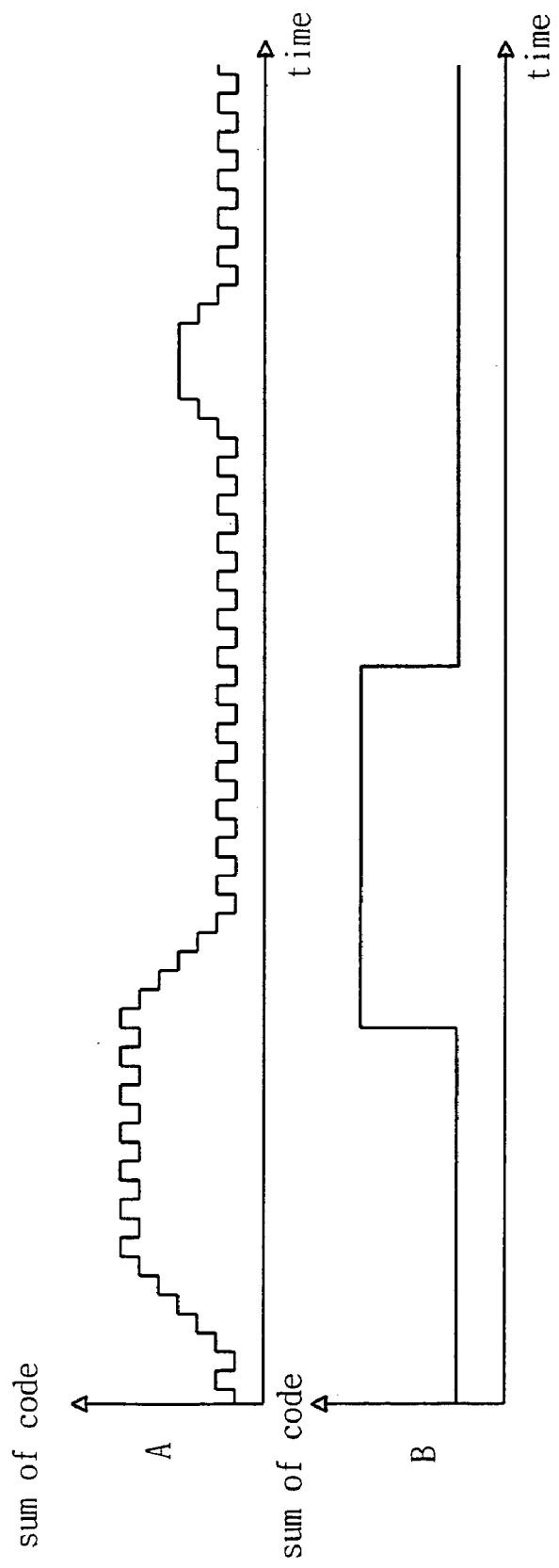
Figure 4:
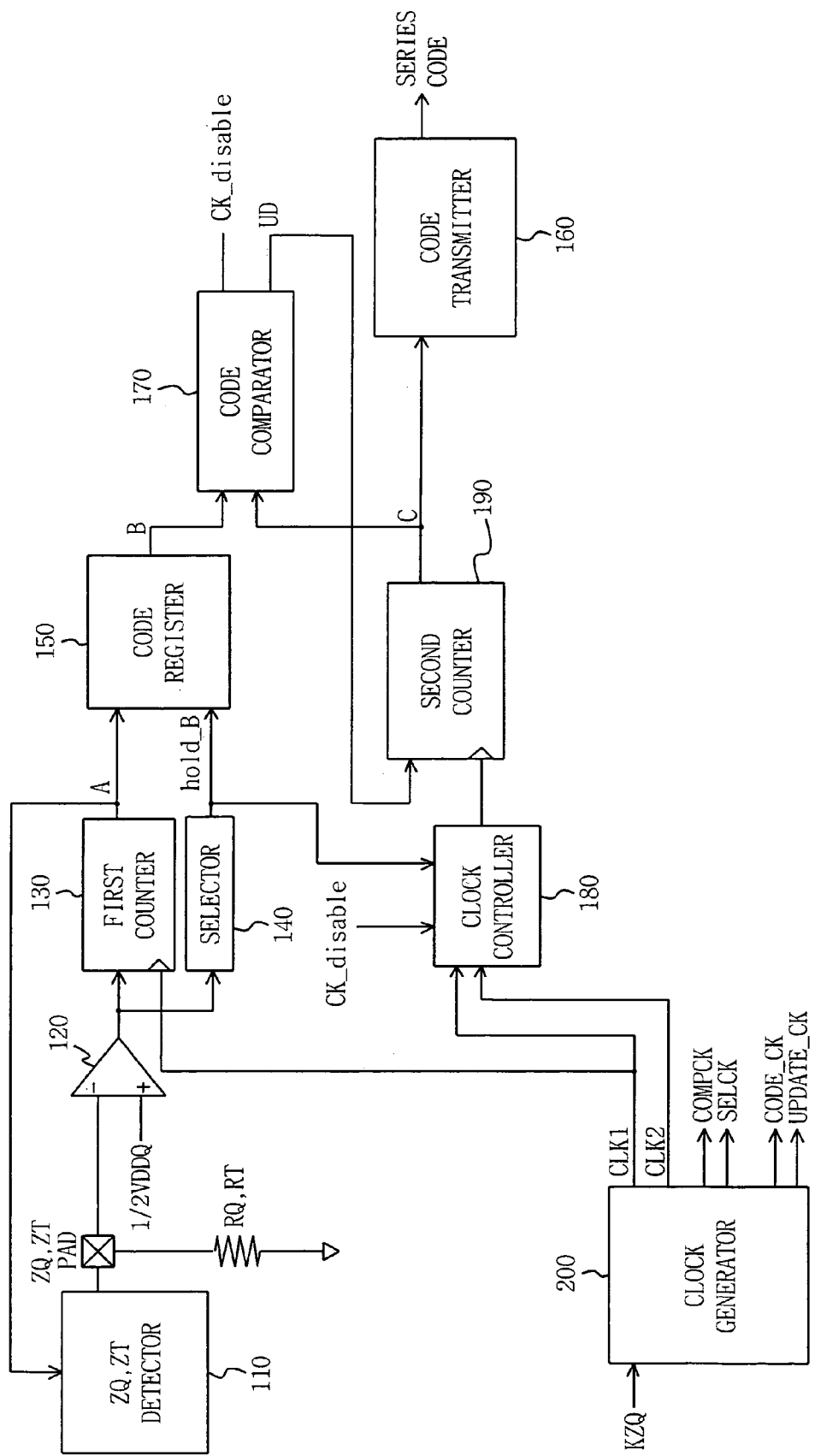
FIG. 4 is a block diagram of programmable impedance controller according to an exemplary embodiment of the invention.

Referring to FIG. 4, a programmable impedance controller according to an exemplary embodiment of the invention includes an external impedance RQ, RT connected to a pad ZQ, ZT PAD, a detector 110, a comparator 120, a first counter 130, a selector 140, a code register 150, a clock controller 180, a second counter 190, a code comparator 170 and a code transmitter 160.

The external impedance RQ, RT is connected between the external pad ZQ, ZT PAD and a ground.

The detector 110 turns on or off P-channel and N-channel MOS transistors within an impedance matching transistor array in response to control code data for an impedance control, and thus outputs a controlled output voltage to the comparator 120.

The comparator 120 individually compares a pad voltage of external pad ZQ, ZT PAD connected to the external impedance RQ, RT, as an output voltage of the detector 110, with a reference voltage ½VDDQ, and outputs an impedance control signal as the comparison result.

The first counter 130 performs an up/down counting in response to the impedance control signal and outputs it as control code data A. The first counter 130 may have a 4 bit binary counter, and may have a 5 bit binary counter.

The selector 140 senses an impedance locking in response to an impedance control signal of the comparator 120 and outputs a sense signal hold_B.

The code register 150 outputs first update code data B in response to the sense signal hold_B of the selector 140 and the control code data.

The detector 110, the comparator 120, the first counter 130, and the selector 140 and the code register 150 may be constructed of circuits generally well-known to those skilled in the art of the invention.

Figure 6:
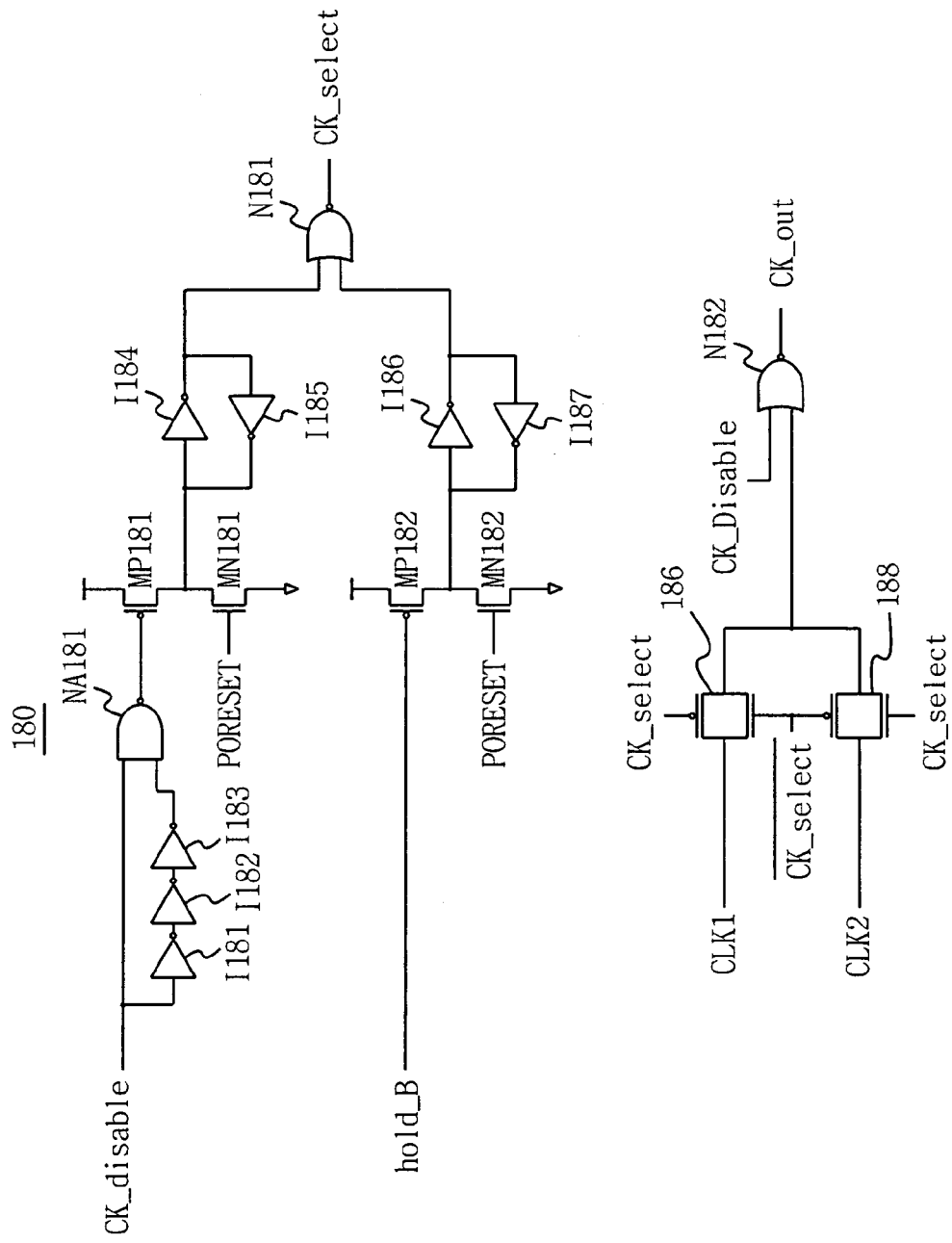
FIG. 6 is a circuit diagram illustrating in detail an example of clock controller shown in FIG. 4.

The clock controller 180 outputs a first clock signal CLK1 until an impedance locking is generated, and outputs a second clock signal CLK2 in response to a sense signal hold_B of the selector 140 and a clock disable signal CK_disable. The second clock signal may be a signal having a period longer than that of the first clock signal. FIG. 6 illustrates a circuit diagram for one example of the clock controller 180, and will be described later.

The second counter 190 updates code data, sequentially, one code step per period of clock signal, in response to the first clock signal CLK1 and an up/down control signal UD, and outputs second update code data C, and also outputs second update code data C in response to the second clock signal CLK2 and an up/down control signal UD.

The second counter 190 may have a 4 bit binary counter or a 5 bit binary counter.

Figure 5:
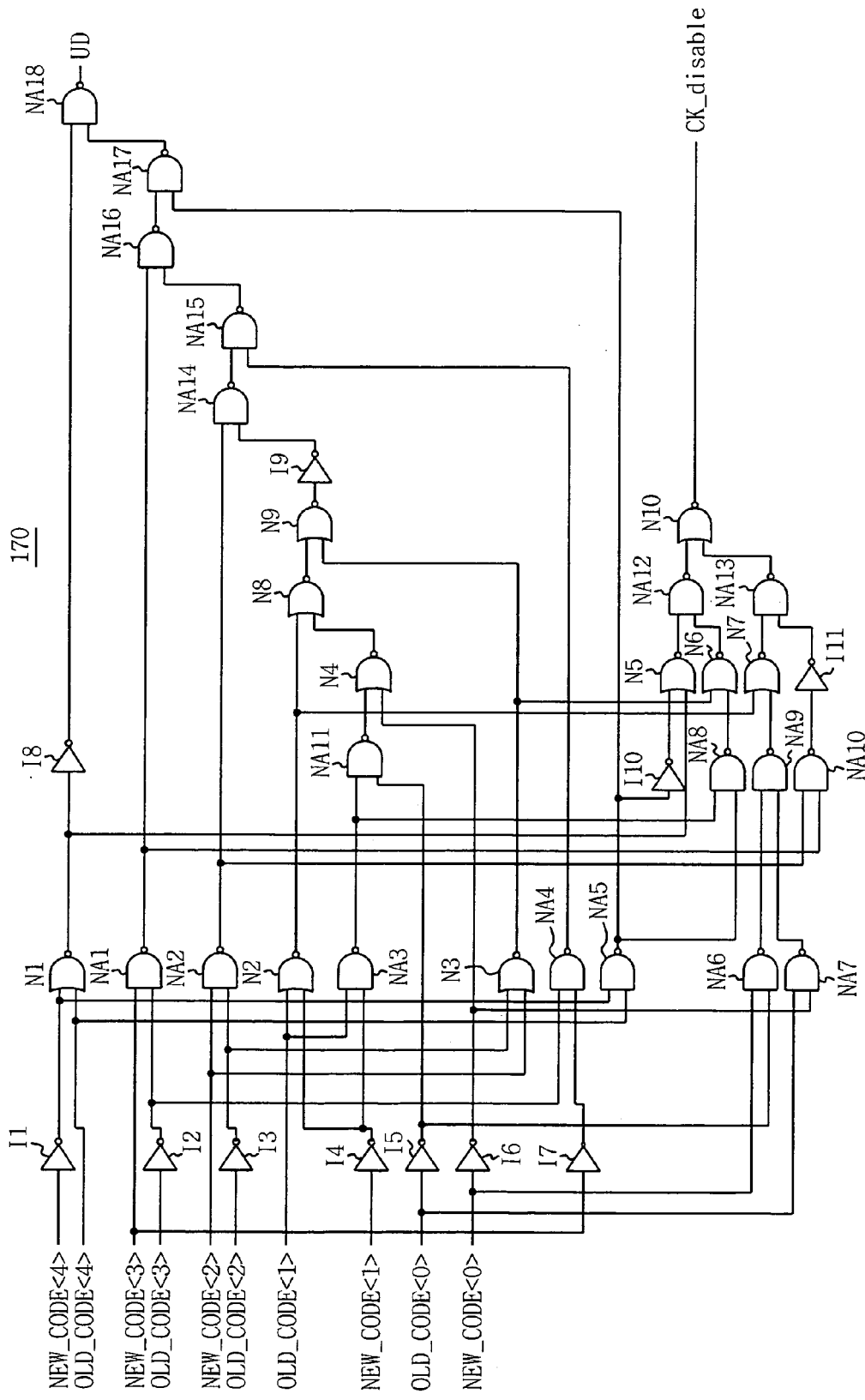
FIG. 5 is a circuit diagram illustrating in detail an example of code comparator shown in FIG. 4.

The code comparator 170 compares the first update code data B with the second update code data C, and outputs an up/down control signal UD corresponding when the code values are different. When the code values are the same, the code comparator 170 outputs a clock disable signal CK_disable. FIG. 5 illustrates a circuit diagram for one example of the code comparator 170, and will be described later.

The code transmitter 160 transmits in series the second update code data C outputted from the second counter 190, as impedance code.

Further, the programmable impedance controller may include a clock generator 200 for supplying clock signals CLK1, CLK2 to the clock controller 180 and CLK1 to the first counter 130.

FIG. 5 is a circuit diagram illustrating one example of the code comparator 170 shown in FIG. 4. The code comparator 170 includes a plurality of inverters I1-I11, a plurality of NAND gates NA1-NA18 and a plurality of NOR gates N1-N10, and may have a wiring structure shown in FIG. 5.

As shown in FIG. 5, the code comparator 170 compares a code value OLD_CODE of first update code data outputted from a code register with a code value NEW_CODE of second update code data outputted from a second counter, and outputs an up/down control signal UD. For example, if the code value OLD_CODE of the first update code data is greater than the code value NEW_CODE of the second update code data, the up/down control signal UD is outputted as a logic 'high'. If the code value OLD_CODE of the first update code data is smaller than the code value NEW_CODE of the second update code data, the up/down control signal UD is outputted as a logic 'low'. If both code values are equal, a clock disable signal CK_disable is generated.

FIG. 6 is a circuit diagram for an example of the clock controller 180 shown in FIG. 4. The clock controller 180 includes a plurality of inverters I181-I187, a NAND gate NA181, a plurality of NOR gates N182, N182, a plurality of P-channel transistors MP181, MP182, a plurality of N-channel transistors MN181, MN182 and a plurality of transmission gates 186 and 188, and may have a wiring structure shown in FIG. 6.

As shown in FIG. 6, the clock controller 180 transfers or outputs a first clock signal CLK1 until an initial power source voltage is supplied and an appropriate impedance locking is generated. Then, when the impedance locking is generated and a sense signal hold_B and a clock disable signal CK_disable are generated in the selector, the clock controller 180 outputs a second clock signal CLK2 that much more changes a period of clock signal transferred to the counter than the period of the first clock signal CLK1, in response to these signals.

Operations of a programmable impedance controller according to an exemplary embodiment will be described as follows, referring to FIGS. 4 to 6.

When power source voltage is supplied to the pad ZQ, ZT PAD, a reset mode starts. In the comparator 120, a pad voltage of external pad ZQ, ZT PAD connected to the external impedance RQ, RT is compared with a reference voltage ½VDDQ, and an impedance control signal is output. The first counter 130 performs an up/down counting in response to the impedance control signal, and outputs control code data to turn on or off P-channel and N-channel MOS transistors provided within an impedance matching transistor array of the detector 110. The detector 110 turns on or off the transistors of the impedance matching transistor array in response to the impedance control signal, and outputs output signals corresponding to that.

The first counter 130 increases or decreases and outputs the control code data A in response to the impedance control signal of the comparator 120, until a level of the reference voltage ½VDDQ and a voltage level of output signal of the detector 110 as a pad voltage become equal. Hence, a transistor selected from P-channel and N-channel transistor array constituting the detector 110 is turned on or off, and the level of reference voltage ½VDDQ and the pad voltage level become equal. In this case, the detector 110 has the same impedance as the external impedance RQ, RT, and becomes a state having dithering effect, an impedance locking state.

The selector 140 senses the impedance locking, and outputs a sense signal hold_B. The code register 150 stores first update code data B having the same code value as the external impedance RQ, RT in the code register 150 in response to the sense signal hold_B.

The clock controller 180 transfers a first clock signal CLK1 supplied from the clock generator 200 to the second counter 190, until the sense signal hold_B is generated from the selector 140. The second counter 190 updates an up/down counting of previously stored code data, each one code at one period, in response to a first clock signal CLK1, and outputs second update code data C. The code comparator 170 compares code values of the first update code data B and the second update code data C. If the code values are different from each other, the code comparator 170 outputs its corresponding up/down control signal UD, and outputs a clock disable signal CK_disable if the code values are equal.

The second counter 190 performs an up/down counting so as to be changed only one code step per clock period by a first clock signal CLK1 and to have the same code value as the first update code data B, in response to the up/down control signal UD, and again outputs second update code data C. Code values of the second update code data C are sequentially changed for only one code each per period; thus, internal noise caused by a rapid change in the prior art controller can be substantially reduced.

When code values of the first update code data B and the second update code data C become equal, an operating mode starts.

The clock controller 180 outputs a second clock signal CLK2 having a period much longer than a first clock signal CLK1 in response to a sense signal hold_B and a clock disable signal CK_disable outputted from the selector 140. The second counter 190 operates by the second clock signal CLK2 and the up/down control signal UD, and as long as there is no additional impedance update, the second counter 190 operates by the reset mode, namely, the first clock signal CLK1, and outputs finally updated second update code data C.

The code transmitter 160 transmits in series the second update code C as impedance code, and performs an impedance update.

Figure 7:
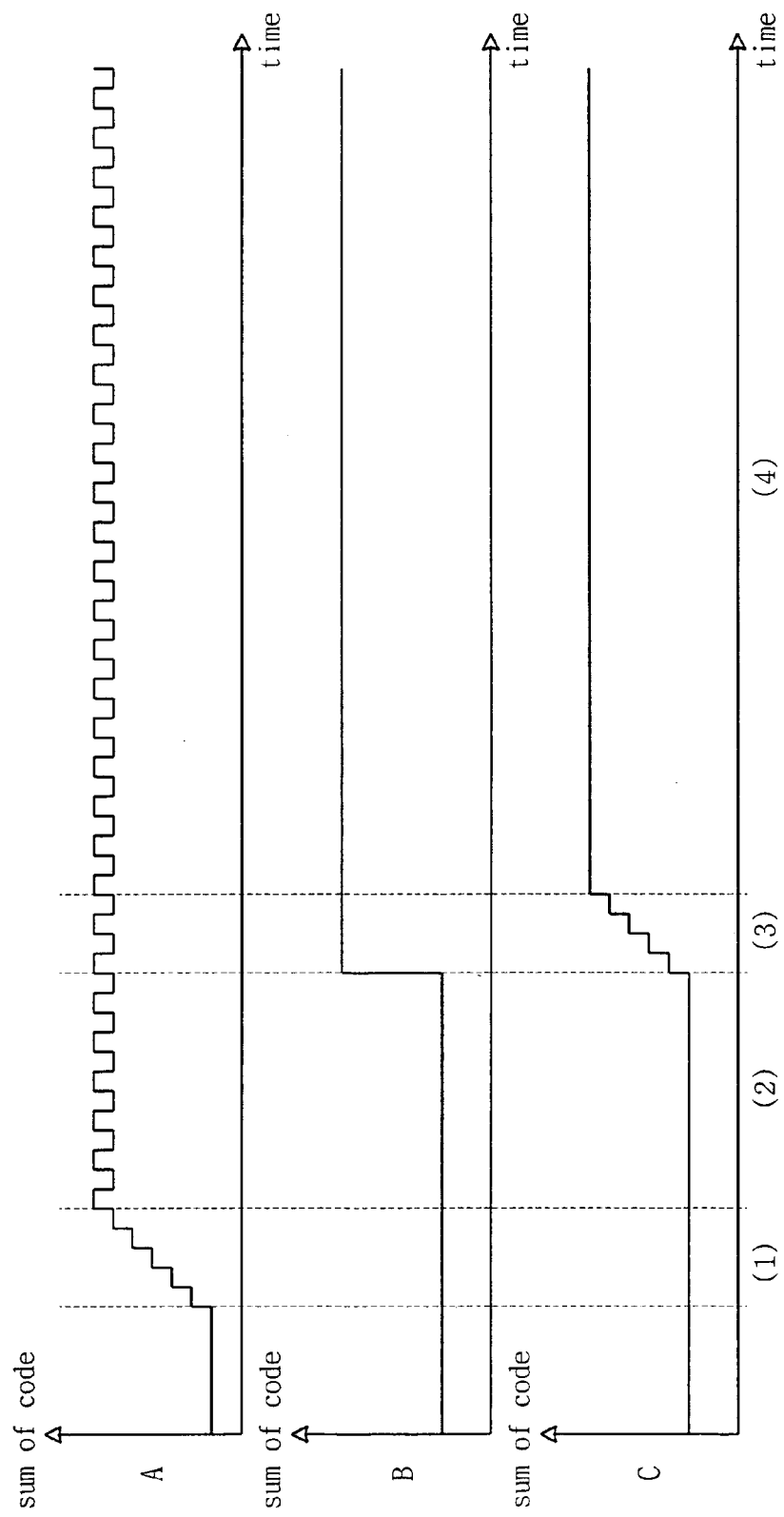
FIGS. 7 to 9 are timing diagrams for operations referred to in FIG. 4.
Figure 8:
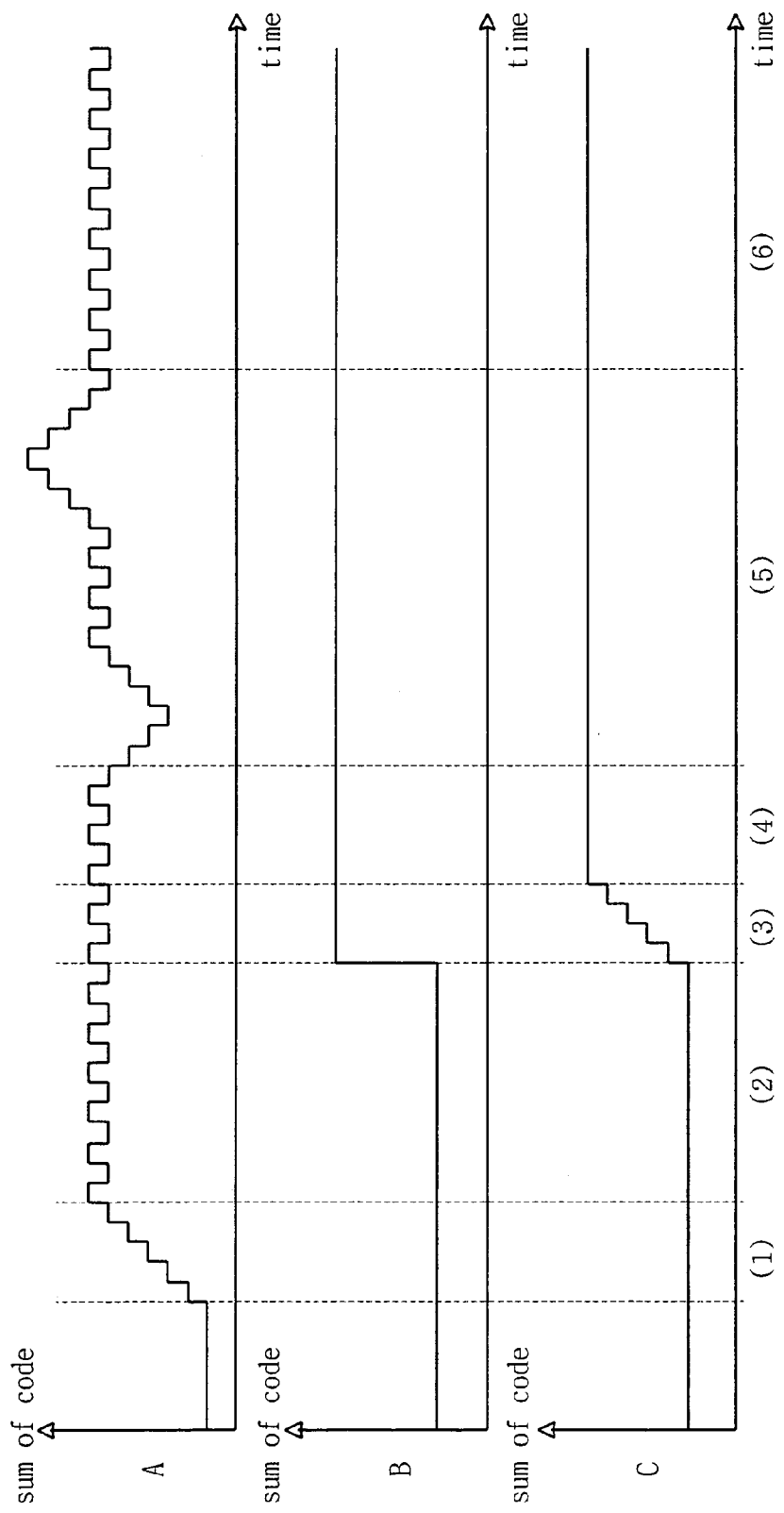
Figure 9:
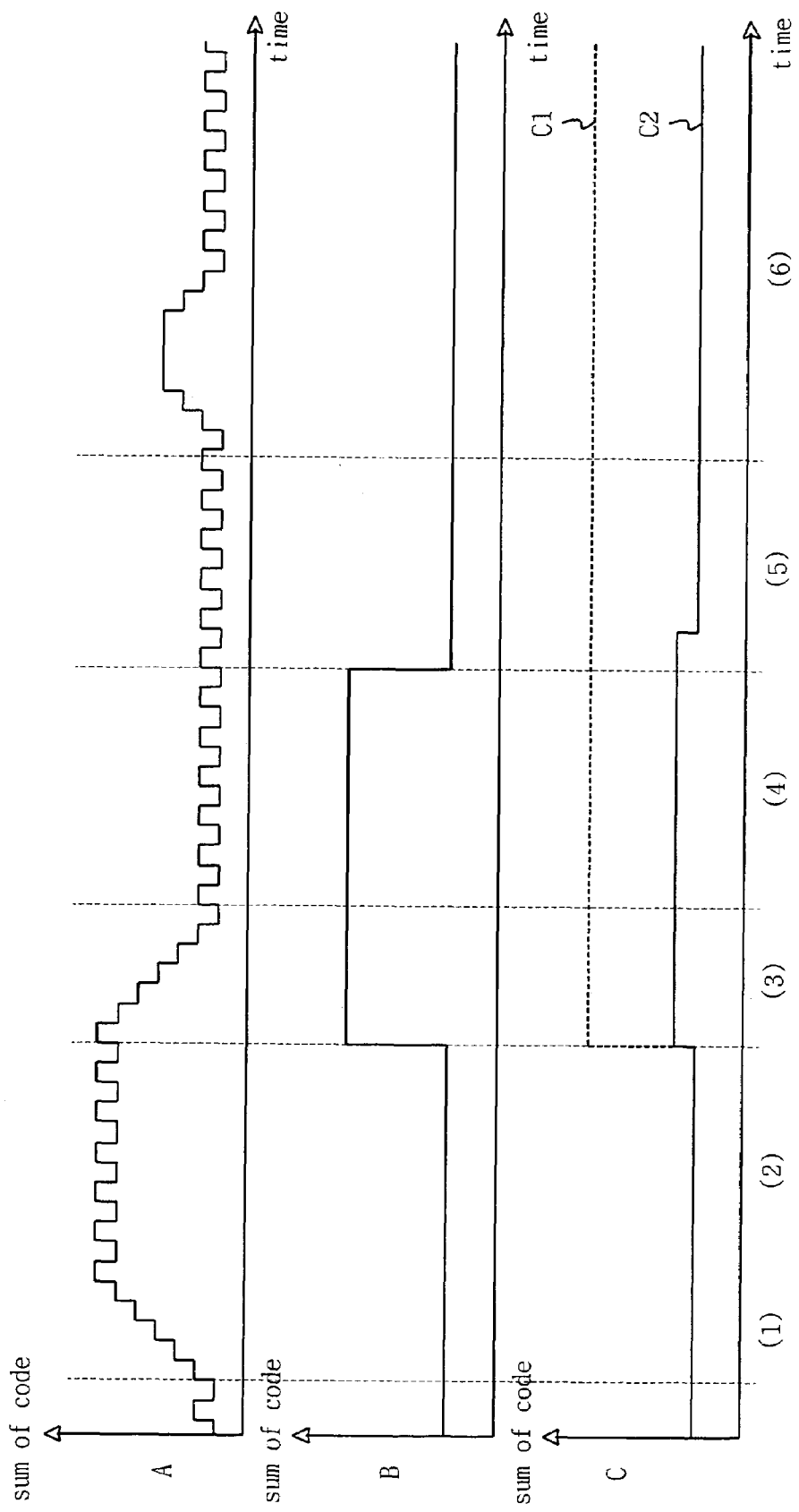

FIGS. 7 to 9 are timing diagrams for operations referred to in FIG. 4.

FIG. 7 illustrates control code data A, first update code data B and second update code data C changed by time lapse in a normal operation.

With reference to FIG. 7, when an operation starts, the control code data A is increasing or decreasing counted to have a code proper to sum matching an impedance at a section (1); then a dithering effect is generated at a section (2). A code value of the first update code data B is changed by the generation of dithering effect for a predetermined duration, and then code values of the second update code data C are sequentially changed, one code step each period, and becomes equal to a code value of the first update code data B. The code value of the second update code data C has a correct impedance code at a section (4).

Second update code data C are sequentially changed one code step per clock period, whereby internal noise from a rapid change of code value can be prevented or substantially reduced.

FIG. 8 illustrates changes of control code data A, first update code data B and second update code data C by time lapse in case noise is temporarily generated after an impedance locking.

As shown in FIG. 8, when an operation starts, the control code data A is increasing or decreasing as counted by a first counter at a section (1), then a dithering effect is generated at a section (2). A code value of the first update code data B is changed by the generation of dithering effect over the duration of section (2), and then code values of the second update code data C are sequentially changed, one code step per clock period, and becomes equal to a code value of the first update code data B at a section (4).

Even if a value of control code data A is temporarily changed by temporary noise later, it is regarded as noise because a dithering over the predetermined duration as in section (2) is not performed, and values of first update code data B and second update code data C remain unchanged. The duration of dithering thus acts as a noise filter.

FIG. 9 illustrates time changes for control code data A, first update code data B and second update code data C in case noise lasts for a long time after an impedance locking.

As shown in FIG. 9, when control code data A is changed at a section (2) by noise that lasts over a predetermined time, first update code data B dithers over a predetermined duration, it is regarded as not noise, and so an updating operation is performed at a section 3. But, second update code data C is controlled by a clock signal having a long period so that the decrease in code data A shown in section (3) does not further sequentially change the code values of code data C. Thus the second update code data C does not have a code value C1 such that noise is reflected as appears in a dot line in the drawing. In other words, noise is not reflected intact, but the second update code data C is updated slowly in section (3) and then is restored to an original value (C2) at sections (4 and 5). Accordingly, influence from external noise lasting for a long time can be prevented or substantially reduced.

As described above, according to an exemplary embodiment of the invention, impedance code is updated, one code step per clock period; accordingly, internal noise caused by a rapid impedance change can be prevented or substantially reduced. After generation of an impedance locking, an update operation is performed by a clock having a long period, whereby influence from noise lasting for a long time can be prevented or substantially reduced.

Embodiments of the invention may be practiced in many ways. What follows are exemplary, non-limiting descriptions of some of these embodiments.

According to an aspect of the invention, a programmable impedance controller for comparing a pad voltage of a pad connected to an external determination impedance with a reference voltage, and for outputting an impedance control signal, and for performing a digital coding to an impedance code corresponding to the impedance control signal. This embodiment includes a clock controller for outputting a first clock signal in a reset mode and outputting a second clock signal in an operating mode, in response to an applied clock signal; and a counter for sequentially updating code data, one code step per clock period, in response to the first clock signal in the reset mode, and outputting update code data, and in an operating mode, outputting the update code data updated at the reset mode in response to the second clock signal.

The second clock signal may be a signal having a period longer than a period of the first clock signal. The counter may include a 4 bit binary counter or 5 bit binary counter.

According to another aspect of the invention, a programmable impedance controller includes a detector, which turns on or off P-channel and N-channel MOS transistors within an impedance matching transistor array and thus responds to control code data for an impedance control; a comparator for individually comparing output voltage of the detector with reference voltage and outputting an impedance control signal as the comparison result; and a first counter for performing an up/down counting in response to the impedance control signal and outputting it as control code data. This embodiment includes a selector for sensing an impedance locking in response to the impedance control signal of the comparator and outputting a sense signal; a code register for outputting first update code data in response to the sense signal of the selector and the control code data; a clock controller for outputting a first clock signal until an impedance locking is generated, and outputting a second clock signal in response to the sense signal of the selector and a clock disable signal. A second counter sequentially updates code data, each one code per clock period, in response to the first clock signal and an up/down control signal at a reset mode, and outputting second update code data, and at an operating mode, outputting the second update code data in response to the second clock signal and the up/down control signal. A code comparator compares the first update code data with the second update code data, outputting an up/down control signal corresponding to when the code values are different, and outputting the clock disable signal when the code values are the same. A code transmitter transmits the second update code data outputted from the second counter, as impedance code.

The programmable impedance controller may further include a clock generator for supplying a clock signal to the detector and the clock controller.

According to another aspect of the invention, a method of operating a programmable impedance controller includes performing an up/down counting in response to an impedance control signal outputted by comparing a pad voltage of a pad connected to an external determination impedance with a reference voltage, and outputting control code data to turn on or off P-channel and N-channel MOS transistors within an impedance matching transistor array; outputting first update code data corresponding to the control code data when an impedance locking is generated; outputting second update code data that are sequentially updated each one code step per clock period until the second update code data has the same code value as the first update code data, in response to a first clock signal at a reset mode and a second clock signal at an operating mode; and transmitting the second update code data as an impedance code.

The second clock signal may be a signal having a period longer than that of the first clock signal.

The inventive systematic and methodic configuration prevents or substantially reduces internal noise and an influence of external noise lasting for a long time.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, internal configuration or elements of circuits can be changed or replaced by other equivalent elements. Accordingly, these and other changes and modifications are seen to be within the true spirit and scope of the invention as defined by the appended claims.

We claim:

1. A programmable impedance controller for comparing a pad voltage of a pad connected to an external determination impedance with a reference voltage, and for outputting an impedance control signal, and for performing a digital coding to an impedance code corresponding to the impedance control signal, the controller comprising:

a clock controller for outputting a first clock signal in a reset mode and outputting a second clock signal in an operating mode, in response to an applied clock signal, wherein the second clock signal has a period longer than that of the first clock signal; and a counter for sequentially updating code data, one code step per clock period, in response to the first clock signal in the reset mode, and outputting update code data, and in an operating mode, outputting the update code data updated at the reset mode in response to the second clock signal.

2. The controller of claim 1, wherein the counter comprises a 4 bit binary counter.

3. The controller of claim 1, wherein the counter comprises a 5 bit binary counter.

4. A programmable impedance controller, comprising:

an impedance detector, which turns on or off P-channel and N-channel MOS (Metal Oxide Semiconductor) transistors within an impedance matching transistor array and produces an output voltage in response to control code data for an impedance control;

a comparator for individually comparing the output voltage of the detector with a reference voltage and outputting an impedance control signal as a comparison result;

a first counter for performing an up/down counting in response to the impedance control signal and outputting a count corresponding to the control signal as control code data;

a selector for sensing an impedance locking in response to the impedance control signal of the comparator and outputting a sense signal;

a code register for outputting first update code data in response to the sense signal of the selector and the control code data;

a clock controller for outputting a first clock signal until an impedance locking is generated, and outputting a second clock signal in response to the sense signal of the selector and a clock disable signal;

a second counter for sequentially updating code data, each one code at one period, in response to the first clock signal and an up/down control signal in a reset mode, and outputting second update code data, and in an operating mode, outputting the second update code data in response to the second clock signal and the up/down control signal;

a code comparator for comparing the first update code data with the second update code data, and outputting an up/down control signal corresponding to when the code values are different, and outputting the clock disable signal when the code values are the same; and a code transmitter for transmitting the second update code data outputted from the second counter, as impedance code.

5. The controller of claim 4, wherein the second clock signal has a period longer than that of the first clock signal.

6. The controller of claim 4, wherein the first and second counters individually comprise a 4 bit binary counter.

7. The controller of claim 4, wherein the first and second counter individually comprise a 5 bit binary counter.

8. The controller of claim 4, further comprising a clock generator for supplying a clock signal to the detector and the clock controller.

9. A method of operating a programmable impedance controller, comprising:

turning on or off P-channel and N-channel MOS (Metal Oxide Semiconductor) transistors within an impedance matching transistor array to produce an output voltage in response to control code data for an impedance control;

comparing the output voltage with a reference voltage and outputting an impedance control signal as a comparison result;

performing an up/down counting in response to the impedance control signal and outputting a count corresponding to the control signal as control code data;

sensing an impedance locking in response to the impedance control signal and outputting a sense signal;

outputting first update code data from a code register in response to the sense signal of the selector and the control code data;

outputting a first clock signal until an impedance locking is generated, and outputting a second clock signal in response to the sense signal of the selector and a clock disable signal;

sequentially updating code data, each one code at one period, in response to the first clock signal and an up/down control signal in a reset mode, and outputting second update code data, and in an operating mode, outputting the second update code data in response to the second clock signal and the up/down control signal;

comparing the first update code data with the second update code data, and outputting an up/down control signal corresponding to when the code values are different, and outputting the clock disable signal when the code values are the same; and transmitting the second update code data as impedance code.

10. The method of claim 9, wherein the second clock signal has a period longer than that of the first clock signal.

* * * * *